(12) United States Patent
Ling

(10) Patent No.: US 6,501,314 B1
(45) Date of Patent: Dec. 31, 2002

(54) PROGRAMMABLE DIFFERENTIAL D FLIP-FLOP

(75) Inventor: Kuok Ling, Calabasas, CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 10/092,246

(22) Filed: Mar. 6, 2002

(51) Int. Cl.[7] .............................................. H03K 3/289
(52) U.S. Cl. ...................................... 327/202; 327/218
(58) Field of Search ........................ 327/57, 199–204, 327/208, 210–215, 218, 219

(56) References Cited

U.S. PATENT DOCUMENTS

| | | | |
|---|---|---|---|
| 5,001,361 A | * | 3/1991 | Tamamura et al. ......... 327/202 |
| 5,815,019 A | * | 9/1998 | Uemura et al. ............. 327/185 |
| 5,892,382 A | * | 4/1999 | Ueda et al. ................. 327/199 |
| 5,945,858 A | * | 8/1999 | Sato ............................ 327/115 |
| 6,011,431 A | * | 1/2000 | Gilbert ....................... 327/551 |
| 6,140,845 A |   | 10/2000 | Benachour .................. 327/57 |
| 6,218,878 B1 | * | 4/2001 | Ueno .......................... 327/202 |
| 6,268,752 B1 | * | 7/2001 | Takahashi et al. .......... 327/117 |

* cited by examiner

*Primary Examiner*—My-Trang Nu Ton
(74) *Attorney, Agent, or Firm*—Lance Kreisman

(57) ABSTRACT

A differential D flip-flop is disclosed including respective master and slave cells. The master cell comprises a first data set circuit and a first data store circuit. The data set circuit has a first differential input and a first differential output. The first data store circuit couples to the output of the first data set circuit. The cell further includes a differential clock circuit and a first current source for generating a fixed bias current in the master cell. The clock circuit having complementary clock inputs to alternatingly set and store data in the data set and data store circuits. The slave cell is formed substantially similar to the master cell, and includes a second differential input coupled to the first differential output of the master cell. The slave cell further includes a second current source for generating a second bias current in the slave cell, the second current source having programmable inputs for varying the slave cell bias current, thereby controlling the delay characteristic of the flip-flop.

13 Claims, 4 Drawing Sheets

PROGRAMMABLE DIFFERENTIAL D FLIP-FLOP

FIELD OF THE INVENTION

The invention relates generally to digital electronic circuitry, and more particularly to differential D flip-flop circuits for automatic test equipment applications.

BACKGROUND OF THE INVENTION

Differential flip-flops provide an important fundamental building block for digital systems. In some applications, differential flip-flops provide a temporary storage function. In other applications, such as automatic test equipment, differential flip-flops provide a way to synchronize data signals with timing signals to form a highly accurate timing generator.

As illustrated in FIG. 1, a conventional D-type differential flip-flop 10 typically includes respective master and slave cells 11 and 13. The master cell employs a data set circuit 12 that receives differential data on the occurrence of a first clock edge from a clock input circuit 14. On a subsequent edge of the clock signal, the data from the data set element is loaded and temporarily stored in a data store circuit 16. On the same clock edge, the data in the data store circuit is provided as the differential input data for the slave cell 13. The data set circuit is typically loaded by an input load circuit (represented by resistors R1 and R2).

With continued reference to FIG. 1, the slave cell 13 is constructed similar to the master cell 11, with its data set circuit receiving the output from the master cell and generating the differential output for the flip-flop 10. Respective master and slave current sources 22 and 24 provide a fixed bias current for the master and slave cells. A more detailed description of this conventional construction is provided in U.S Pat. No. 6,140,845, to Benachour.

In one automatic test equipment application, the differential D flip-flop is implemented at the front end of a timing generator circuit 18, with the clock input circuit 14 receiving signals from a system clock 19. Timing data signals from a pattern generator 20 feed differential data to the complementary flip-flop data input. The output of the flip-flop drives a delay line 21. Typically, the delay line includes several identical delay stages 23, each having input data circuitry 25 in the form of a differential pair of transistors (not shown), and load circuitry 26 defined by a plurality of load transistors (not shown) to establish a predefined delay cell D.

Conventionally, the differential flip-flop delay is different from the delay line delay, often causing a substantial timing error. One of the major reasons for the error is the mismatch between the delay element load circuitry 26 and the flip-flop input load circuitry (R1, R2). This timing error may, in some circumstances, take more than half of an allowable timing error budget for high frequency applications. In some circumstances, further delay circuitry is implemented in an effort to address this problem. Unfortunately, the additional circuitry often takes the form of additional delay lines that adds to hardware costs, and uses valuable circuit area (chip space) and power.

What is needed and currently unavailable is a differential D flip-flop with a circuit construction that allows control over the flip-flop delay to maximize accuracy for the timing circuitry. The differential D flip-flop of the present invention satisfies these needs.

SUMMARY OF THE INVENTION

The programmable flip-flop of the present invention provides a programmable current source capability while implementing circuitry having delay characteristics similar to a delay-locked-loop (DLL) delay cell. In this manner, the flip-flop exhibits delay characterisitcs similar to the DLL delay cells that can be fine-tuned to track the DLL delays by programmably controlling the flip-flop bias current.

To realize the foregoing advantages, the invention in one form comprises a differential flip-flop including respective master and slave cells. The master cell comprises a first data set circuit and a first data store circuit. The data set circuit has a first differential input and a first differential output. The first data store circuit couples to the output of the first data set circuit. The cell further includes a differential clock circuit and a first current source. The clock circuit having complementary clock inputs to alternatingly set and store data in the data set and data store circuits. The slave cell is formed substantially similar to the master cell, and includes a second differential input coupled to the first differential output of the master cell. The slave cell further includes a second current source having programmable inputs to vary the bias current in the slave cell, thereby controlling the delay characteristic of the flip-flop.

In another form, the invention comprises a timing circuit for use in automatic test equipment. The timing circuit includes a delay line having a plurality of delay elements for generating timing signals, each of the delay elements having delay load circuitry to generate a similar delay D. The circuit further includes a differential data source for generating timing data values, a differential system clock, and a differential D flip-flop. The differential D flip-flop includes a master cell having a fixed delay and respective master data and master clock inputs. The master data input is coupled to the data source and the master clock input is coupled to the differential system clock. The differential D flip-flop further includes a slave cell having respective slave data and slave clock inputs. The slave data input is coupled to the master cell differential output with the slave clock input inversely coupled to the differential system clock. The slave cell further includes a slave differential output and a programmable input to vary the delay of the slave differential output to match the similar delay D of each of the delay cells.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

The differential flip-flop of the present invention provides a programmable capability that allows it to establish a delay characteristic that can track the delay characteristics associated with delay elements implemented in a delay line. This is accomplished by configuring the flip-flop similar to the delay elements, and providing a programmable bias current to the flip-flop circuitry. By ensuring minimal uncertainties in the relative delays between the flip-flop and other delay elements, a more accurate differential output signal is achieved for high speed applications.

Figure 1:
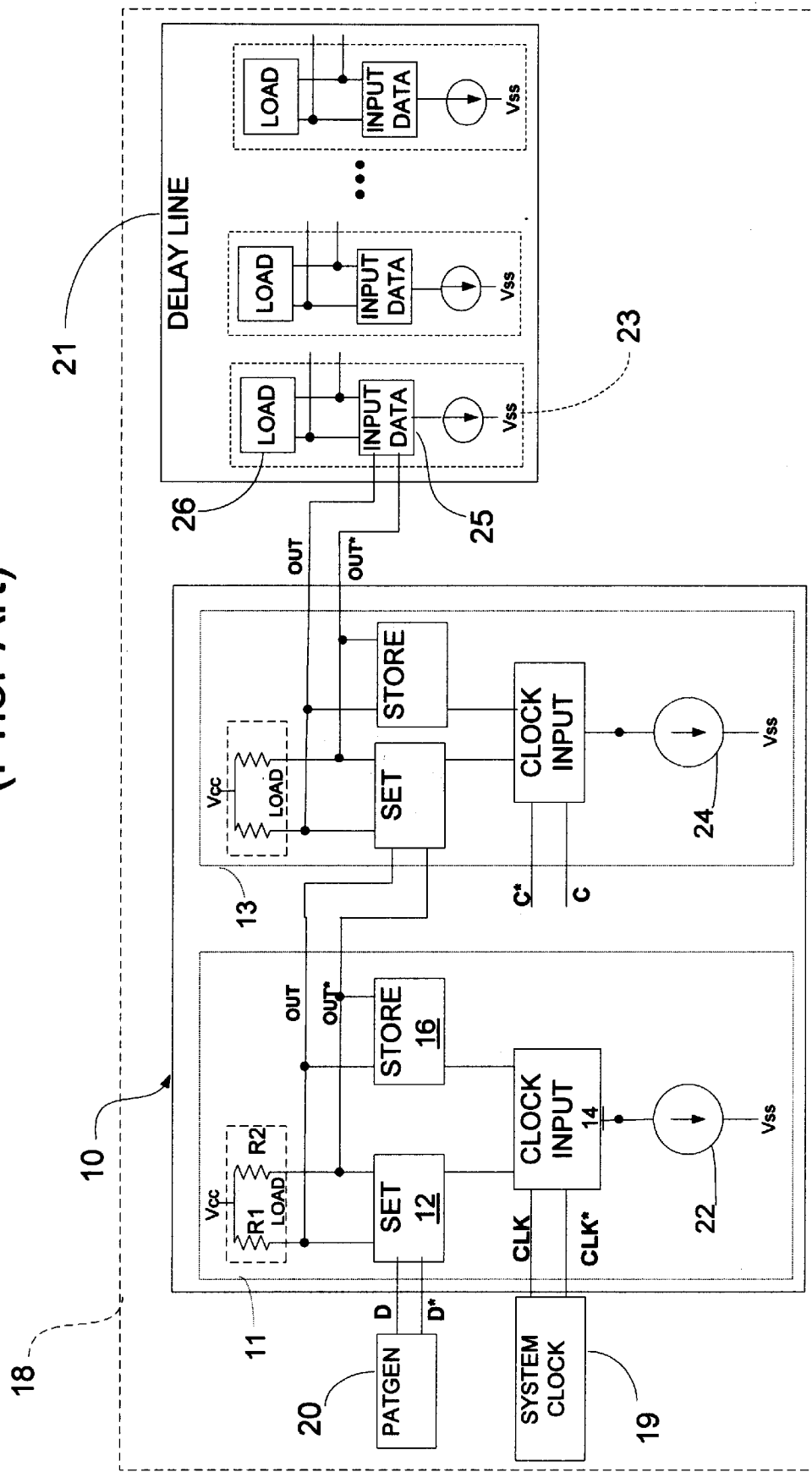
FIG. 1 is a high-level block diagram of a conventional timing circuit for use in automatic test equipment applications.
Figure 2:
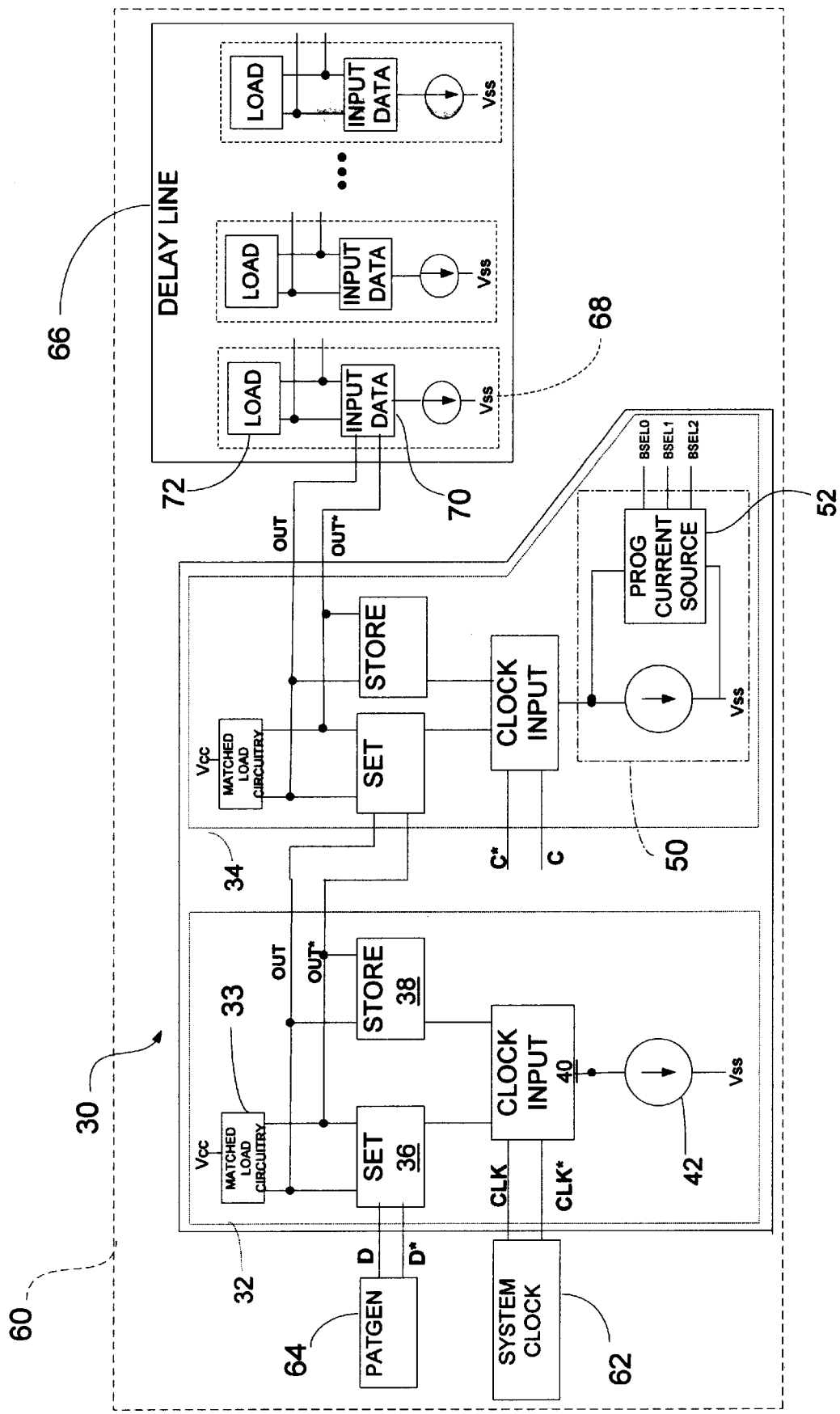
FIG. 2 is a high-level block diagram of a timing circuit employing a differential flip-flop according to one form of the present invention.

Referring now to FIG. 2, the differential flip-flop according to one form of the present invention, generally designated 30, is of the "D" type and is implemented in a timing circuit 60 to synchronize a system clock 62 with timing data signals provided by a pattern generator 64. The flip-flop output OUT, OUT* is coupled to a delay line 66 that comprises a plurality of delay elements 68. Each of the delay elements includes input data circuitry 70 and load circuitry 72 configured to establish a set delay.

Further referring to FIG. 2, the differential D flip-flop 30 includes respective master and slave cells 32 and 34. The cells are formed similar to each other and are disposed in a cascaded configuration such that the output of the master cell provides the input to the slave cell. For purposes of clarity, only the master cell 32 will be described in detail.

Figure 3:
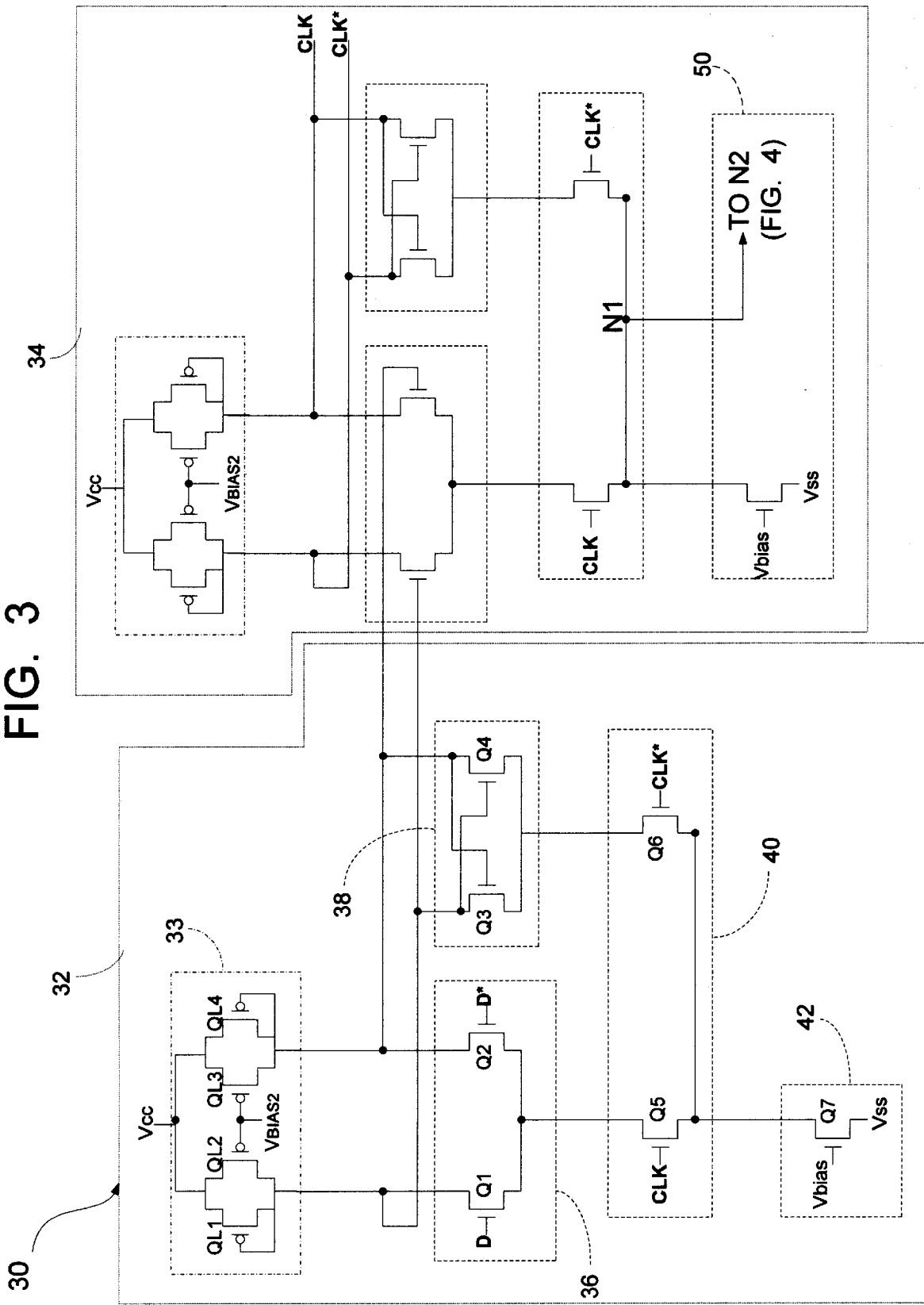
FIG. 3 is a schematic illustration of a slave cell of the differential flip-flop of FIG. 1.

With reference to FIGS. 2 and 3, the master cell 32 includes data set circuitry 36 comprising a differential pair of MOS transistors Q1 and Q2 with complementary data inputs D and D*. The data set circuitry is formed similar to the differential pair input data circuitry for each delay element 68 of the timing circuit delay line 66. These inputs serve as the flip-flop differential data inputs.

Further referring to FIGS. 2 and 3, coupled to the data set circuitry 36 is a matched load circuit 33 configured to match the load circuitry 72 employed in each delay element 68. As shown in FIG. 3, the matched load circuit 33 takes the form of PMOS load transistors QL1–QL4 disposed in a balanced complementary pair of load paths. Each path has its load transistors (such as QL1, QL2) interconnected by their respective source and drain terminals. A bias voltage VBIAS2 is fed to the gate of one of the transistors (such as transistor QL2), while the gate of the other transistor (such as transistor QL1) is shorted to its drain terminal. The source terminals are tied to the supply voltage VCC. This arrangement provides a stable and predictable delay for both load paths.

Tapping into the data set drain terminals is a pair of cross-coupled MOS transistors Q3 and Q4 configured to form a data store circuit 38. Each gate of the data store transistors couples to the opposite drain terminal, with both source terminals interconnected.

Further referring to FIG. 3, both the data set circuit 36 and the data store circuit 38 are responsive to a clock input circuit 40 comprising complementary transistors Q5 and Q6. Transistor Q5 includes a positive clock input CLK and a drain terminal tied to the data set transistor source terminals. A similar configuration is employed for transistor Q6, but with an inverted clock input CLK*. The master cell circuitry is biased by a current source 42, comprising MOS transistor Q7 driven by bias voltage VBIAS. In the timing circuit application described herein, clock signals from the system clock 62 provide the input to the clock circuitry.

As noted above, the slave cell 34 is formed similar to the master cell 32 except for the provision of a programmable feature, more fully described below, to supplement the fixed bias current.

The inventor has discovered that although tailoring the flip-flop load circuitry to match the delay element load circuitry provides substantial improvements in minimizing relative delays, fine-tuning the flip-flop delay is possible by altering the bias current in the slave cell 34. To provide the ability to change the bias current through the slave cell, and thereby vary the delay associated with the entire flip-flop 30, the present invention employs a current source 50 that includes unique programmable current source circuitry 52 (FIG. 4).

Figure 4:
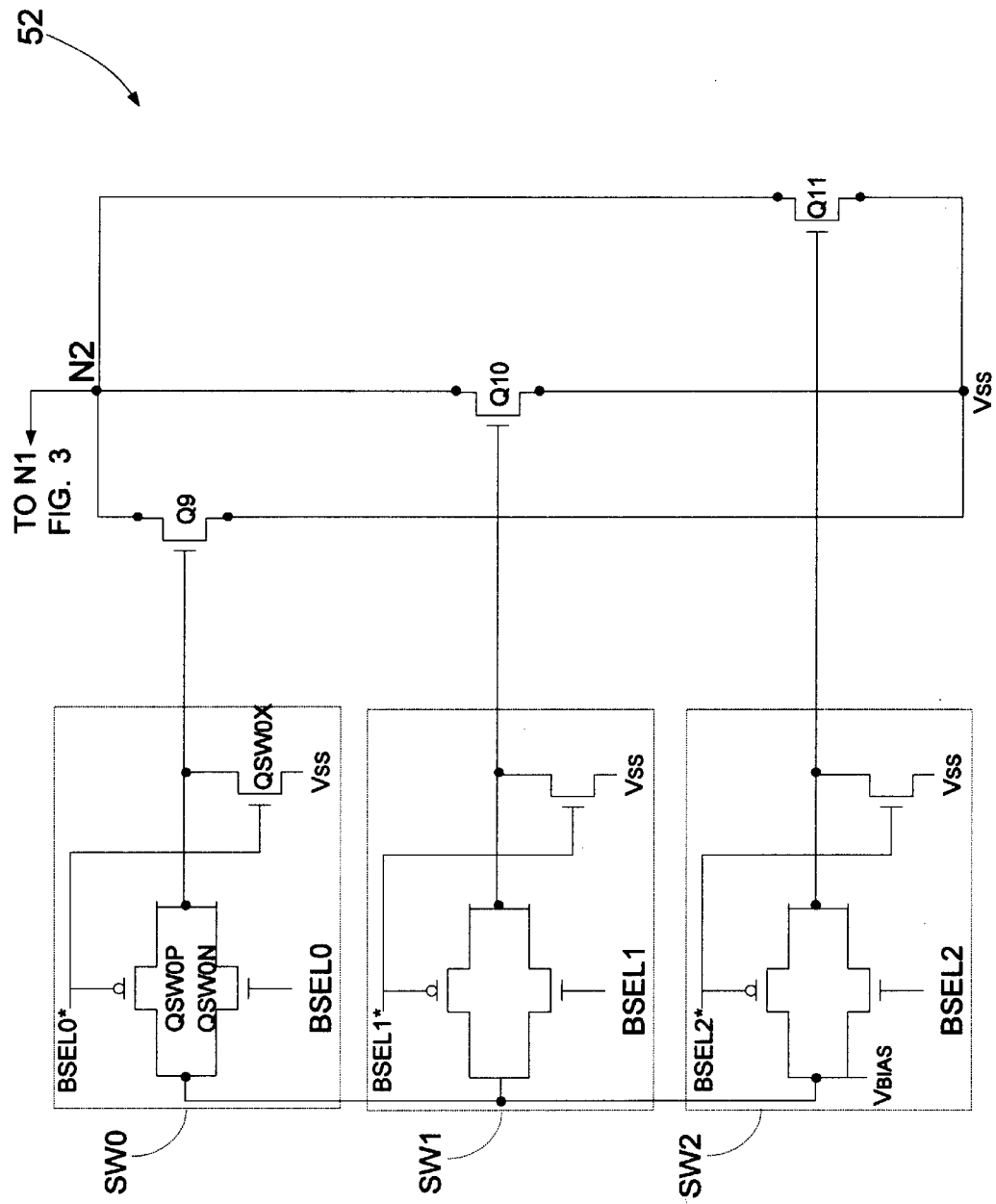
FIG. 4 is a schematic illustration of the programmable current source employed in the slave cell of FIG. 3.

Referring now to FIG. 4, the programmable current source circuitry 52 includes a plurality of MOS current drivers Q9, Q10, and Q11 disposed in parallel and configured to produce a binary-weighted current adjustment scheme. Each current driver has its gate terminal coupled to a semiconductor switch (SW0, SW1, or SW2, depending on the driver) to effect on/off operation. For purposes of clarity, only one of the three switches will be described in detail.

The semiconductor switch SW0 includes an NMOS transistor QSWON having its source and drain terminals coupled to the drain and source terminals of a PMOS transistor QSWOP. The gate to the NMOS transistor responds to an input command signal BSEL. The complementary gate (for the PMOS transistor) is tied to a shutoff NMOS transistor QSWOX. The complementary gate will be high when the command signal is not asserted, thereby driving the shutoff transistor to shut the gate of transistor Q9 to a low level VSS.

Preferably, driver Q9 adds 5% to the fixed bias current while drivers Q10 and Q11 add 10% and 20%, respectively. By appropriately programming the input bits, a variety of supplemental cureent levels are available.

In operation the input data is passed (i.e. clocked) to the output of the master cell 32 when CLK goes from a logic low to a logic high level, and subsequently latched and stored into data store 38 when CLK goes back to a logic low level; changes in the input data will not affect the output of the master cell at this stage since it has been successfully stored in data store 38. At the same time that data is latched into data store 38 in the master cell, it is also being passed to the output of the slave cell, i.e. the output of the flip-flop, and on the the delay line 66. On the subsequent low to high transition of the CLK signal the output data is latched and stored in data store of the slave cell, which completes the data transfer from the input to the output of the D flip-flip.

As data is clocked through the flip-flop 30, it undergoes a delay due to, among other factors, the load circuitry 33, the data set circuitry 38 and the clock circuitry 40. As explained above, a portion of this delay can be matched to, or track, the delay associated with each delay element 68 by constructing the load circuitry 33 in the flip-flop to match the load circuitry 72 in each delay element. However, by appropriately programming the slave cell current source 50, supplemental current may be sourced or sunk from the fixed current source 51 to slightly alter the flip-flop delay. The inventor has found that this adjustable delay is sufficient to enable the flip-flop delay to fully track the delay element delay on a given die.

In an optional configuration, the differential D flip-flop of the present invention includes a reset feature as more fully described in U.S. patent application Ser. No. 10/090,593, titled "High-Speed Fully Balanced Differential D Flip-Flop With Reset", filed Feb. 28, 2002, assigned to the assignee of the present invention, and expressly incorporated by reference herein.

The inclusion of the reset ability allows the differential D flip-flip 30 to be used not only in the synchronization of timing data to the automatic test equipment's system clock 62, it also allows it to be used to generate formatted timing waveforms to perform integrated circuit testing.

Those skilled in the art will appreciate the many benefits and advantages afforded by the present invention. Of significant importance is the ability to progammably change the bias current in the slave cell to modify the flip-flop delay, allowing the flip flop to track the delays in a delay line. This minimizes the innaccuracy involved in precision timing, enabling the timing system to be implemented by a low-cost CMOS process.

While the invention has been particularly shown and described with reference to the preferred embodiments thereof, it will be understood by those skilled in the art that various changes in form and detail may be made therein without departing from the spirit and scope of the invention. For example, although the master cell is described as having a fixed current source, it may also include the programmable current source as described herein, for even greater delay tracking ability.

What is claimed is:

1. A differential flip-flop including:
    a master cell comprising
        a first data set circuit having a first differential input and a first differential output,
        a first data store circuit coupled to the output of the first data set circuit,
        a differential clock circuit having complementary clock inputs to alternatingly set and store data in the data set and data store circuits, and
        a first current source for generating a fixed bias current in the master cell; and
    a slave cell formed substantially similar to the master cell, the slave cell having
        a second differential input coupled to the first differential output of the master cell, and
        a second current source for generating a second bias current in the slave cell, the second current source having programmable inputs for varying the slave cell bias current;
    whereby the varying slave cell bias current provides control over the delay characteristics of the differential flip-flop.

2. A differential flip-flop according to claim 1 wherein:
    the second current source includes a plurality of binary-weighted current sources disposed in parallel to provide a selectable bias current.

3. A differential flip-flop according to claim 1 wherein:
    the master cell and slave cell are formed from a CMOS process.

4. A differential flip-flop for use in a timing system having a plurality of delay cells, each of the delay cells having delay load circuitry to generate a similar delay D, the flip-flop including:
    a master cell having a fixed delay; and
    a slave cell having a programmable input to vary the delay of the flip-flop output to track the similar delay D of each of the delay cells.

5. A differential flip-flop for use in a timing system according to claim 4 wherein the master cell comprises:
    a first data set circuit having a first differential input and a first differential output,
    input load circuitry substantially matching the delay load circuitry,
    a first data store circuit coupled to the output of the first data set circuit,
    a differential clock circuit having complementary clock inputs to alternatingly set and store data in the data set and data store circuits, and
    a first current source for generating a fixed bias current in the master cell.

6. A differential flip-flop for use in a timing system according to claim 5 wherein the slave cell is formed similar to the master cell and further comprises:
    a second differential input coupled to the first differential output of the master cell, and
    a second current source for generating a second bias current in the slave cell, the second current source having programmable inputs for varying the slave cell bias current.

7. A differential flip-flop for use in a timing system according to claim 6 wherein:
    the second current source includes a plurality of binary-weighted current sources disposed in parallel to provide a selectable bias current.

8. A differential flip-flop for use in a timing system according to claim 6 wherein:
    the master cell and slave cell are formed from a CMOS process.

9. A timing circuit for use in automatic test equipment, the timing circuit including:
    a delay line having a plurality of delay elements for generating timing signals, each of the delay elements having delay load circuitry to generate a similar delay D;
    a differential data source for generating timing data values;
    a differential system clock; and
    a differential D flip-flop, the differential D flip-flop including
        a master cell having a fixed delay and respective master data and master clock inputs, the master data input coupled to the data source and the master clock input coupled to the differential system clock, the master cell having a differential output; and
        a slave cell having respective slave data and slave clock inputs, the slave data input coupled to the master cell differential output and the slave clock input inversely coupled to the differential system clock, the slave cell further including a slave differential output and a programmable input to vary the delay of the slave differential output to track the similar delay D of each of the delay cells.

10. A timing circuit for use in automatic test equipment according to claim 9 wherein the master cell comprises:
    a first data set circuit;
    input load circuitry substantially matching the delay load circuitry;
    a first data store circuit coupled to the input of the first data set circuit;
    a differential clock circuit having complementary clock inputs to alternatingly set and store data in the data set and data store circuits; and
    a first current source for generating a fixed bias current in the master cell.

11. A timing circuit for use in automatic test equipment according to claim a wherein the slave cell is formed similar to the master cell and further comprises:
    a second differential input coupled to the first differential output of the master cell, and
    a second current source for generating a second bias current in the slave cell, the second current source having programmable inputs for varying the slave cell bias current.

12. A timing circuit for use in automatic test equipment according to claim 11 wherein:
    the second current source includes a plurality of binary-weighted current sources disposed in parallel to provide a selectable bias current.

13. A timing circuit for use in automatic test equipment according to claim 11 wherein:
    the master cell and slave cell are formed from a CMOS process.

* * * * *